United States Patent [19]

Yamada

[11] Patent Number: 4,713,561
[45] Date of Patent: Dec. 15, 1987

[54] TRANSISTOR CIRCUIT WITH CONTROLLED COLLECTOR SATURATION VOLTAGE

[75] Inventor: Kazuyoshi Yamada, Tokyo, Japan

[73] Assignee: NEC Corporation, Japan

[21] Appl. No.: 15,512

[22] Filed: Feb. 10, 1987

Related U.S. Application Data

[63] Continuation of Ser. No. 687,385, Dec. 28, 1984, abandoned.

[30] Foreign Application Priority Data

Dec. 28, 1983 [JP] Japan ................... 58-247013

[51] Int. Cl.$^4$ ................. H03K 19/003; H03K 19/084; H03K 19/088; H03K 17/30

[52] U.S. Cl. ..................... 307/456; 307/457; 307/564; 307/565; 307/567; 307/270; 307/300

[58] Field of Search .............. 307/454, 455, 456, 457, 307/458, 254, 564, 565, 567, 270, 280, 300, 299 A

[56] References Cited

U.S. PATENT DOCUMENTS

| | | | |
|---|---|---|---|
| 3,461,314 | 8/1969 | Standeven et al. | 307/457 X |
| 3,544,808 | 12/1970 | Mukai | 307/456 |
| 3,614,467 | 10/1971 | Tu | 307/456 X |
| 3,736,572 | 5/1973 | Tu | 307/270 X |
| 3,858,059 | 12/1974 | Khanna | 307/270 X |
| 3,868,517 | 2/1975 | Schoeff | 307/270 X |
| 4,045,689 | 8/1977 | Tietz | 307/456 |
| 4,365,316 | 12/1982 | Iwahashi et al. | 307/297 X |
| 4,454,432 | 6/1984 | Wood | 307/456 |
| 4,501,979 | 2/1985 | Null et al. | 307/270 X |
| 4,527,078 | 7/1985 | Smith | 307/456 X |

FOREIGN PATENT DOCUMENTS 143840 11/1980 Japan ................. 307/456

OTHER PUBLICATIONS

Spadavecchia et al, "Low-Power Current Switch Circuity with Higher Power External Drive Circuitry"; *IBM-TDB;* vol. 14, No. 12, pp. 3688-3689; 5/1972.

*Primary Examiner*—Stanley D. Miller
*Assistant Examiner*—David R. Bertelson
*Attorney, Agent, or Firm*—Laff, Whitesel, Conte & Saret

[57] ABSTRACT

A transistor circuit includes an input terminal, an output terminal, a first transistor having a collector connected to the output terminal, a second transistor having a collector-emitter passage connected between the collector of the first transistor and the input terminal, a PN junction element such as a diode or a base-emitter junction of another transistor, which is connected between the input terminal and the base of the first transistor, a first resistor connected between the emitter and base of the second transistor, and a second resistor connected between the base and collector of the second transistor.

9 Claims, 5 Drawing Figures

TRANSISTOR CIRCUIT WITH CONTROLLED COLLECTOR SATURATION VOLTAGE

This application is a continuation of application Ser. No. 687,385 filed Dec. 28, 1984, abandoned.

BACKGROUND OF THE INVENTION

1. Field of the Invention:

The present invention relates to a transistor circuit used in a logic circuit, and more particularly to a transistor circuit in which collector saturation voltage is controlled or restricted.

2. Description of the Prior Art:

In a logic circuit, a signal has two levels of either "1" or "0". A transistor receiving this signal is driven into either a conductive state or a cut-off state. Accordingly, when the transistor is driven into the conductive state, a large volume of base current flows, which results in the so-called collector saturation state. If collector saturation has taken place, electrical charges are accumulated in a base region. Under such collector saturation state, if the input signal is changed to drive the transistor into the cut-off state, the transistor cannot change its electrical state to the cut-off state until this accumulated charges have been discharged. Consequently, there is a drawback in that the operable speed of the transistor circuit is limited. This drawback becomes more serious at the output stage where the transistor is strongly driven into the saturated state in order to obtain a large output current.

As a means of controlling such excess collector saturation, there has been known a method of connecting a Schottky diode between the collector and the base. In other words, this method ensures that the collector potential does not drop below the forward biased voltage of the Schottky diode from the base potential even if the base-emitter junction is strongly forward-biased so that a large base current will flow. Between a PN junction and a Schottky junction, the Schottky junction produces a lower forward biased voltage, so that the collector potential does not drop below the emitter voltage. For this reason, surplus input current is by-passed to the collector via the Schottky diode, with the result that an excess base current does not flow and the volume of the charges accumulated in the base region is restricted. Accordingly, it is possible to restrict the time for discharging the accumulated charges and to accelerate the operating speed.

However, when incorporating such a Schottky-clamped transistor circuit into an integrated circuit, it requires an additional step of forming the Schottky junction electrode, in addition to the usual steps of forming an integrated circuit. As a result, an increase in the number of manufacturing processes and changes of the manufacturing conditions are not available. This results in shortcomings of increasing production costs and a drop in the production yield. In addition, there is another drawback in that the collector saturation voltage cannot be arbitrarily controlled, since the forward voltage of the Schottky diode is self-determined by the metallic material of the Schottky electrode.

SUMMARY OF THE INVENTION

An object of the present invention is to provide a transistor circuit with collectors saturation voltage controlled, which is suitable to be formed in an integrated circuit.

Another object of the present invention is to provide a transistor circuit in which collector saturation voltage can be arbitrarily determined.

According to the present invention, there is provided a transistor circuit comprising: an input terminal; a main transistor having a base, an emitter, and a collector; an output terminal connected to the collector of the main transistor; a PN junction element connected between the input terminal and the base of the main transistor; an additional transistor having a collector connected to the input terminal and an emitter connected to the collector of the main transistor; a first resistor connected between the base and emitter of the additional transistor; and a second resistor connected between the base and collector of the additional transistor.

Such a transistor circuit is constituted by bipolar transistors, a PN-junction diode, and resistors, and does not require such a special element as a Schottky diode. Consequently, it is readily possible to incorporate such a circuit into an integrated circuit by conventional integrated circuit technology only.

In addition, the collector-emitter voltage of the additional transistor can be arbitrarily determined by selecting the resistance values of the first and second resistors. By setting this collector-emitter voltage within a range from one to two times of a forward voltage of the PN junction element, it is possible to control, as desired, the minimum value of the collector voltage of the main transistor.

BRIEF DESCRIPTION OF THE DRAWINGS

The above and further objects, features and advantages of the present invention will become more apparent from the following detailed description taken in conjunction with the accompanying drawings, wherein:

As shown in FIG. 1, in the output stage of a conventional TTL circuit, an input signal from an input terminal IN is received by the base of a transistor $Q_3$. The voltages obtained across resistors $R_3$ and $R_4$ connected to the emitter and collector of the transistor $Q_3$ are supplied to the bases of transistors $Q_1$ and $Q_4$. The collector of the transistor $Q_4$ is connected to the power source Vcc, while the emitter is connected to the output terminal OUT and the collector of the transistor $Q_1$ via a diode $D_1$. The emitter of the transistor $Q_1$ is grounded together with the resistor $R_3$.

In this circuit, if a "H" level is applied to the signal input terminal IN as an input signal, the transistor $Q_3$ is energized, so that an emitter current flows to the resistor $R_3$. As a result, the base potential of the transistor $Q_1$ rises. When this base potential of the transistor $Q_1$ reaches the forward voltage of the base-emitter forward voltage $V_F$, the transistor $Q_1$ is energized, so that the voltage at the signal output terminal OUT drops to an "L" level of logic signal which is approximately 0.3 V. At this juncture, in order to obtain a large output current from the signal output terminal OUT, the base current of the transistor $Q_1$ is designed to be supplied from the emitter of the transistor $Q_3$ with a large value by which the transistor $Q_1$ is driven into the so-called collector saturation state. Thereafter, if the "L" level is applied to the signal input terminal IN so as to set the signal output terminal OUT to the "H" level, there occurs a phenomenon in which the output voltage does not rise until the excess charges accumulated in base region of the transistor $Q_1$ is completely discharged. In other words, this gives rise to the drawback that the operating speed is limited by that amount of time.

Figure 1:
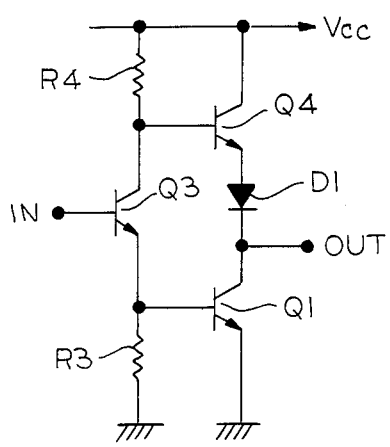
FIG. 1 is a circuit diagram which illustrates an example of an output stage of a conventional TTL circuit.
Figure 2:
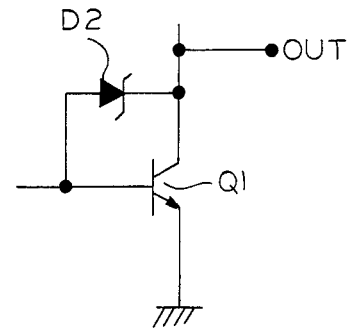
FIG. 2 is a circuit diagram of the conventional Schottky-clamped transistor circuit.

FIG. 2 is a circuit diagram of the output stage transistor $Q_1$ in which the charge-accumulating effect of the transistor $Q_1$ shown in FIG. 1 is decreased. A Schottky diode $D_2$ is connected between the collector and base of the transistor $Q_1$ so as to clamp the collector voltage of the transistor $Q_1$.

In the improved output stage using the transistor $Q_1$ having the clamp circuit of the Schottky diode, the voltage difference between the collector and base of the transistor $Q_1$ is clamped by a forward voltage (0.4 to 0.5 V) of the Schottky diode $D_2$ which is lower than the PN junction diode. Therefore, the collector voltage does not drop below a voltage lower than the base voltage by the Schottky diode forward voltage. That is, the excess driving current is bypassed to the collector of the transistor $Q_1$ through the Schottky diode $D_2$. As a result, the collector saturation of the transistor $Q_1$ is substantially weekened as compared with a case in which the Schottky diode $D_2$ is not provided. For this reason, the charges accumulated in the base region of the transistor $Q_1$ is reduced, which, in turn, substantially reduces the operating time for turning off the transistor $Q_1$, thereby permitting high-speed operation of the circuit.

Nevertheless, the usage of the Schottky diode $D_2$ makes it necessary to employ a special manufacturing process for forming it in an integrated circuit resulted in an increase in the number of manufacturing processes and changes in the manufacturing conditions. Accordingly, there arise drawbacks of leading to higher production costs and a drop in yield.

In addition, since the forward voltage of the Schottky diode $D_2$ is determined by the metal material of the Schottky electrode, there is another shortcoming in that the collector saturation voltage of the transistor $Q_1$ cannot be arbitrarily controlled.

PREFERRED EMBODIMENTS OF THE INVENTION

Some preferable embodiments of the present invention will be explained with reference to the drawings.

Figure 3:
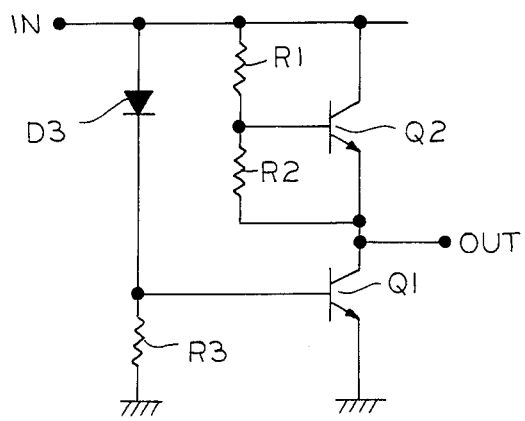
FIG. 3 is a circuit diagram showing a first embodiment of the present invention.

FIG. 3 is a circuit diagram of a first embodiment of the present invention. This first embodiment includes a first transistor $Q_1$ having a collector connected to a signal output terminal OUT and an emitter grounded, a second transistor $Q_2$ having an emitter connected to a signal output terminal OUT and a collector connected to an input terminal IN, a first resistor $R_1$ connected between the collector and base of the second transistor $Q_2$, a second resistor $R_2$ connected between the base and emitter of the second transistor $Q_2$ and a diode $D_3$ having an anode connected to the input terminal IN and a cathode connected to the base of the first transistor $Q_1$.

On applying an input signal of "H" level to the input terminal IN, the transistor $Q_1$ is turned on by receiving the current at its base through the diode $D_3$ to drop the voltage at the output terminal OUT, whereby an output signal having an "L" level is obtained at the output terminal OUT. Now, the operation of the circuitry constituted by the resistors $R_1$ and $R_2$ and transistor $Q_2$ will be explained. The relationship between the collector-emitter voltage $V_{CE2}$, of the transistor $Q_2$, the output voltage $V_{OUT}$ and the input voltage $V_{IN}$ is as follows:

$$V_{OUT}=V_{IN}-V_{CE2} \tag{1}$$

Here, since input voltage $V_{IN}$ is clamped by the sum of the forward voltages $V_F$ of the base-emitter junction of the transistor $Q_1$ and the diode $D_3$, the maximum voltage of the input voltage $V_{in}$ is as follows:

$$V_{IN}=2V_F \tag{2}$$

Furthermore, the collector-emitter voltage $V_{CE}$ can be calculated as follows:

(i) Since the voltage across the resistor $R_2$ is the forward voltage $V_F$ of the base-emitter junction of the transistor $Q_2$, the current flowing through the resistor $R_2$ becomes $V_F/R_2$.

(ii) Accordingly, if the base current of the transistor $Q_2$ is neglected, the voltage across the resistor $R_1$ is $R_1 \cdot V_F/R_2$.

(iii) From the above, the collector-emitter voltage $V_{CE2}$ is expressed as the sum of the voltages across the resistors $R_1$ and $R_2$, and is as follows:

$$V_{CE2}=V_F+R_1/R_2 \cdot V_F=(1+R_1/R_2)V_F \tag{3}$$

From the formulas (1) through (3), the following formula holds for the output voltage $V_{OUT}$:

$$V_{OUT}=2V_F-(1+R_1/R_2)V_F=(1-R_1/R_2)V_F \tag{4}$$

In the formula (4), if the resistance ratio $R_1/R_2$ is designed to be an appropriate value of "1" or less, it becomes possible to clamp the output voltage $V_{OUT}$ at a desired value in the range of "0" to $V_F$. This means that the depth of the collector saturation of the transistor $Q_1$ can be arbitrarily controlled.

In an integrated circuit, such a resistance ratio $R_1/R_2$ can be realized to a high accuracy. The forward voltage of the PN junction $V_F$ is about 0.75 V. If the resistance ratio $R_1/R_2$ is set to 0.52, the output voltage $V_{OUT}$ is clamped by about 0.4 V, similar to the clamp voltage of the transistor having a clamp circuit of the Schottky diode. Here, since resistors $R_1$ and $R_2$ and the transistor $Q_2$ does not require special structures and are elements which are similar to other transistors and resistors, the whole circuit can be formed by the usual process for manufacturing the integrated circuits.

Figure 4:
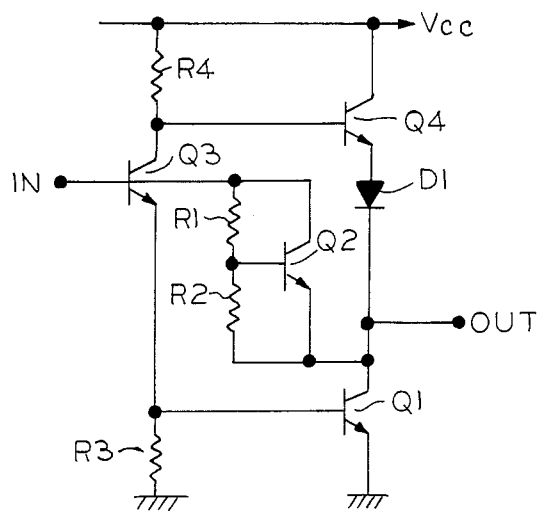
FIG. 4 is a circuit diagram of the output stage of a TTL circuit according to a second embodiment of the present invention.

FIG. 4 is a circuit diagram of a TTL circuit according to a second embodiment of the present invention. This embodiment corresponds to the conventional TTL circuit of FIG. 1 and uses the circuit shown in FIG. 3 with a replacement of the diode $D_3$ with a base-emitter junction of a transistor $Q_3$. A transistor $Q_1$ has a collector connected to the output terminal OUT and an emitter grounded. A transistor $Q_2$ has an emitter connected to the output terminal OUT and a collector connected to the input terminal IN. A first resistor $R_1$ is connected between the base and collector of the transistor $Q_2$. A second resistor $R_2$ is connected between the base and emitter of the transistor $Q_2$. Another transistor $Q_4$ is connected to receive the collector voltage of the transistor $Q_3$ at its base. An emitter of the transistor $Q_4$ is connected to the base of the first transistor $Q_1$ through a diode $D_1$. A collector of the transistor $Q_4$ is connected to the power source $V_{CC}$. The resistors $R_3$ and $R_4$ are respectively connected at the emitter and the collector of the transistor $Q_4$.

When the "H" level of the input signal is applied to the input terminal IN, the transistor $Q_3$ is driven into the cut-off state and the transistor $Q_1$ is into the saturation state. The collector voltage of the transistor $Q_1$, i.e., the output voltage $V_{OUT}$, is clamped by $(1-R_1/R_2)V_F$ by the circuitry constituted by the resistors $R_1$ and $R_2$ and the transistor $Q_2$, as explained in the case of the first embodiment. If the resistance ratio $R_1/R_2$ is designed as 0.52, the output voltage of "L" level becomes about 0.4 V as explained in the aforementioned first embodiment. Accordingly, the collector-emitter voltage $V_{CE}$ of the transistor $Q_1$ does not fall below 0.4 V, and the degree of the collector saturation of the transistor $Q_1$ is held week. The value of the charges accumulated in the base of the transistor $Q_1$ is small. Thereafter, when the "L" level is applied to the signal input terminal IN, the transistor $Q_1$ is promptly turned off, and the voltage at the signal output terminal OUT shifts quickly to the "H" level. Incidentally, since the transistors $Q_1$ and $Q_3$ are turned off at the output "H" level, no current flows through the resistor $R_4$, with the result that $V_{OUT}$ (H) equals "$V_{CC}-2V_F$", which is the so-called TTL "H" level.

Figure 5:
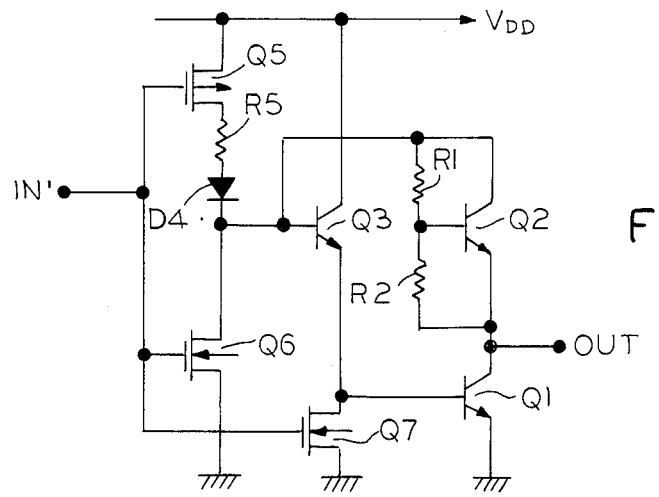
FIG. 5 is a circuit diagram of a circuit according to a third embodiment of the present invention.

FIG. 5 is a circuit diagram of a third embodiment of the present invention in which the present invention is applied to a circuit incorporating a complementary MOS field effect transistor circuit and a bipolar transistor circuit. In this third embodiment, the cathode of a diode $D_4$ corresponds to the input terminal IN of the second embodiment shown in FIG. 4. An N-channel MOS transistor $Q_7$ is used in place of the resistor $R_3$ shown in FIG. 4. The gates of series connected MOS transistors $Q_5$ and $Q_6$ are commonly connected to an input terminal IN'. The MOS transistors $Q_5$ and $Q_6$, a resistor $R_5$ and a diode $D_4$ are connected in series to constitute a complementary MOS inverter. Through this inverter, the base potential of the transistor $Q_3$ is changed in accordance with an input signal applied to the input terminal IN'. The resistor $R_5$ and the diode $D_4$ are inserted to control the base current of the transistor $Q_3$ as well as the current to the resistors $R_1$ and $R_2$ and the transistor $Q_2$.

When the input terminal IN' is at the "L" level (normally, the grounding potential), the transistor $Q_6$ is turned off and the transistor $Q_5$ is turned on to rise the cathode potential of the diode $D_4$. Then, the transistors $Q_1$ and $Q_3$ are turned on. At this moment, clamping of the voltage at the base of the transistor $Q_3$ is effected at about $2 \cdot V_F$. Meanwhile, the output voltage $V_{OUT}$ becomes the TTL "L" level by clamped by the circuitry of the resistors $R_1$ and $R_2$ and the transistor $Q_2$.

On the other hand, when the input terminal IN' is at the "H" level (normally, the $V_{DD}$ potential), the transistor $Q_5$ is turned off and the transistor $Q_6$ is turned on. The cathode of the diode $D_4$ drops virturally to the grounding potential. All the transistors $Q_1$, $Q_3$ and $Q_2$ are turned off. The output voltage is quickly turned to have "H" level. At this moment, the output terminal OUT becomes an electrically "floating" state. In order to avoid such "floating" state, a resistor may be connected between the output terminal OUT and the power source $V_{DD}$.

In the embodiment shown in FIG. 5, since MOS transistor, the manufacturing process of which is simple, is combined with the bipolar transistors in the circuit, the number of manufacturing processes considerably increases and the processes become quite complicated if the Schottky diode is used as the clamp circuit of the transistor $Q_1$. However, it becomes possible to reduce such complication in the manufacturing processes by replacement of such Schottky diode with the circuitry of the resistors $R_1$ and $R_2$ and the transistor $Q_2$.

Although an NPN transistor is used as the transistor $Q_1$ in the aforementioned embodiments, it is apparent to the skilled in the art that it is also possible to embody the present invention by using a PNP transistor, and that similar effects can be obtained. In addition, as the transistor $Q_2$, it is also possible to employ a conductive type transistor which is different from a conductive type of the transistor $Q_1$. In such a case, the emitter of the transistor $Q_2$ is connected to the input terminal IN and the collector to the output terminal OUT.

As described above in detail, according to the present invention, it is possible to obtained a transistor circuit in which the collector saturation of the transistor can be controlled without accompanying an increase in the number of manufacturing processes.

What is claimed is:

1. A transistor circuit comprising: an input terminal for receiving an input signal; an output terminal for leading out an output signal:
    a first transistor having an emitter, a base, and a collector, said collector of said first transistor being connected to said output terminal, said base and said collector of said first transistor being free from any connections to a Schottky diode;
    a second transistor having a base and having a collector-emitter passage connected between said input terminal and the collector of said first transistor;
    a PN junction element connected between said input terminal and the base of said first transistor;
    a first resistor connected between the collector and base of said second transistor;
    a second resistor connected between the base and emitter of said second transistor;
    a load having one end connected to the collector of said first transistor; and
    means for supplying operating power between said emitter of said first transistor and another end of said load, whereby said first transistor is prevented from being driven into saturation condition without using any Schottky diode.

2. A transistor circuit as claimed in claim 1 wherein said PN junction element is a base-emitter junction of a third transistor.

3. A transistor circuit as claimed in claim 2 wherein the ratio between the resistance values of said first resistor and second resistor is "1" or below.

4. A transistor circuit as claimed in claim 1 wherein said second transistor has a collector connected to said input terminal and an emitter connected to the collector of said first transistor.

5. A transistor circuit as claimed in claim 2 wherein said load is a fourth transistor having a base connected to a collector of said third transistor, an emitter operating as said one end of said load, and a collector operating as said other end of said load.

6. A transistor circuit comprising:
    an input terminal for receiving an input signal;

a first transistor having a base connected to said input terminal and having a collector and an emitter, said base and said collector of said first transistor being free from any connections to a Schottky diode;

a second transistor having a base connected to the emitter of said first transistor, and having a collector and an emitter, said base and said collector of said second transistor being free from a Schottky diode;

a third transistor having a base connected to the collector of said first transistor, and having a collector and an emitter, said base and said collector of said third transistor being free from any connections to a Schottky diode;

an output terminal;

means for connecting the collector of said second transistor, the emitter of said third transistor, and said output terminal;

a fourth transistor having a base and having an emitter-collector path inserted between the base of said first transistor and the collector of said second transistor;

a first resistor connected between the collector and base of said fourth transistor;

a second resistor connected between the emitter and base of said fourth transistor; and means for supplying power between the collector of said third transistor and the emitter of said second transistor, whereby said second transistor is kept in a non-saturation condition without using any Schottky diode.

7. A transistor circuit as claimed in claim 6 wherein said connecting means is a diode having one end connected to the emitter of said third transistor and the other end connected to the collector of said second transistor and said output terminal.

8. A transistor circuit as claimed in claim 6 wherein said first, second, third and fourth transistors have the same conductivity type, and said fourth transistor has a collector connected to the base of said first transistor and an emitter connected to the collector of said second transistor.

9. A transistor circuit as claimed in claim 6 wherein the resistance ratio of said first resistor to said second resistor is equal to or less than one.

* * * * *